United States Patent

Beilstein, Jr. et al.

[11] Patent Number: 5,923,181
[45] Date of Patent: *Jul. 13, 1999

[54] METHODS AND APPARATUS FOR BURN-IN STRESSING AND SIMULTANEOUS TESTING OF SEMICONDUCTOR DEVICE CHIPS IN A MULTICHIP MODULE

[75] Inventors: Kenneth Edward Beilstein, Jr., Essex Junction; Claude Louis Bertin, South Burlington, both of Vt.; Dennis Charles Dubois, Salt Point, N.Y.; Wayne John Howell, Williston, Vt.; Gordon Arthur Kelley, Jr., Essex Junction, Vt.; Christopher Paul Miller, Underhill, Vt.; David Jacob Perlman, Wappingers Falls, N.Y.; Gustav Schrottke, Austin, Tex.; Edmund Juris Sprogis; Jody John VanHorn, both of Underhill, Vt.

[73] Assignee: International Business Machine Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/840,041

[22] Filed: Apr. 24, 1997

Related U.S. Application Data

[62] Division of application No. 08/497,126, Jun. 30, 1995, Pat. No. 5,686,843.

[51] Int. Cl.$^6$ .................................................. G01R 31/02
[52] U.S. Cl. ............................................ 324/758; 324/760
[58] Field of Search ..................................... 324/765, 760, 324/754, 758; 438/14, 17; 257/40, 48

[56] References Cited

U.S. PATENT DOCUMENTS

| | | | |
|---|---|---|---|
| 4,027,935 | 6/1977 | Byrnes et al. | 339/48 |
| 4,220,917 | 9/1980 | McMahon, Jr. | 324/555 |
| 4,441,075 | 4/1984 | McMahon | 371/22.3 |
| 4,567,432 | 1/1986 | Buol et al. | 324/760 |
| 4,584,681 | 4/1986 | Singh et al. | 371/10 |
| 4,697,095 | 9/1987 | Fujii | 307/243 |
| 4,770,640 | 9/1988 | Walter | 439/69 |
| 4,845,426 | 7/1989 | Nolan et al. | 324/760 |
| 4,918,335 | 4/1990 | Chall, Jr. | 307/303.1 |
| 5,001,423 | 3/1991 | Abrami et al. | 324/760 |
| 5,047,711 | 9/1991 | Smith et al. | 324/760 |
| 5,270,261 | 12/1993 | Bertin et al. | 437/209 |
| 5,315,552 | 5/1994 | Yoneda | 365/200 |
| 5,374,888 | 12/1994 | Karasawa | 324/765 |
| 5,386,386 | 1/1995 | Ogihara | 365/200 |
| 5,397,997 | 3/1995 | Tuckerman et al. | 324/754 |
| 5,414,637 | 5/1995 | Bertin et al. | 364/489 |
| 5,426,566 | 6/1995 | Beilstein, Jr. et al. | 361/735 |
| 5,502,333 | 3/1996 | Bertin | 257/685 |
| 5,537,051 | 7/1996 | Jalloul et al. | 324/754 |
| 5,539,324 | 7/1996 | Wood et al. | 324/758 |
| 5,589,781 | 12/1996 | Higgins et al. | 324/758 |

OTHER PUBLICATIONS

Beilstein et al., "Silicon Cube Burn–In Methodology", IBM Technical Disclosure Bulletin, vol. 37, No. 57, pp. 573–574, Jul. 1994.

*Primary Examiner*—Vinh P. Nguyen
*Attorney, Agent, or Firm*—Heslin & Rothenberg, P.C.

[57] ABSTRACT

Methods and apparatus are set forth for burn-in stressing and simultaneous testing of a plurality of semiconductor device chips laminated together in a stack configuration to define a multichip module. Testing is facilitated by connecting temporary interconnect wiring to an access surface of the multichip module. This temporary interconnect wiring electrically interconnects at least some semiconductor device chips within the module. Prior to burn-in stressing and testing, a separate electrical screening step occurs to identify any electrical defect in the connection between the temporary interconnect wiring and the multichip module. If an electrical defect is identified, various techniques for removing or isolating the defect are presented. Thereafter, burn-in stressing and simultaneous testing of the semiconductor chips within the multichip module occurs using the temporary interconnect wiring. Various alignment and test fixtures are described for facilitating this burn-in and simultaneous testing of the semiconductor chips within the multichip module.

7 Claims, 10 Drawing Sheets

5,923,181

METHODS AND APPARATUS FOR BURN-IN STRESSING AND SIMULTANEOUS TESTING OF SEMICONDUCTOR DEVICE CHIPS IN A MULTICHIP MODULE

This application is a division of application Ser. No. 08/497,126 filed Jun. 30, 1995 which application is now: U.S. Pat. No. 5,686,843.

TECHNICAL FIELD

The present invention relates in general to testing of high density integrated circuit packages, and more particularly, to methods and apparatus for burn-in stressing and simultaneous testing of a plurality of semiconductor device chips laminated together as a stack to comprise a "multichip module."

BACKGROUND ART

Semiconductor structures comprising three-dimensional arrays of chips or layers have emerged as an important packaging approach. A typical three-dimensional electronic package consists of multiple integrated chips having main planar surfaces laminated together to form a monolithic, multichip module, also referred to as a "stack" or "cube". Two common types of multichip modules are the vertically-extending (or "pancake") stack and the horizontally-extending (or "breadloaf") stack. When completed, a metallization pattern is often provided directly on one (or more) edge surface(s) of the multichip module for operationally interconnecting the semiconductor chips and for electrically connecting the module to external circuitry. This metallization, sometimes referred to herein as "application metal," can include individual electrical connects, bussed electrical connects and multi-level wiring.

FIG. 1 depicts a typical multichip module, generally denoted 10, consisting of multiple semiconductor integrated circuit chips 12 laminated together. An application metal 14 resides on one (or more) side surface of stack 10 for operationally interconnecting the chips and/or for electrical connection of the module to external circuitry. Application metallization 14 includes both individual contacts 16 and bussed contacts 18. Module 10 with metallization 14 thereon, is positioned on an upper surface 21 of a carrier 20, which has its own metallization pattern 22 for connecting thereto. Solder bump interconnection between stack 10 and substrate 20 is commonly employed.

Presently, chip or wafer level burn-in stressing and testing are practiced, as well as burn-in stressing and testing of the resultant stack/carrier package before approval for shipment to a customer. By only testing at the chip and then the package level, significant fabrication time and expense can go into the module without knowing whether a defect has occurred in the fabrication process. To guard against the possibility of a failed package, at least one redundant chip is often provided in the multichip module so that if one of the primary chips in the module is found defective following stack fabrication be "invoked" to provide the electronic circuit package with the desired performance level. This activity is commonly referred to in the art as "sparing."

Presented herein are various novel burn-in stressing and testing approaches to evaluating a multichip module, as well as numerous sparing approaches related thereto.

DISCLOSURE OF THE INVENTION

Briefly summarized, the present invention comprises in one aspect a method for testing a multichip module which includes: connecting temporary interconnect wiring to the multichip module to electrically interconnect at least some semiconductor device chips within the module to facilitate electrical testing thereof; simultaneously electrically testing the at least some semiconductor chips within the module employing the temporary interconnect wiring; and, thereafter, disconnecting the temporary interconnect wiring from the multichip module.

In another aspect, a method for testing a multichip module is provided which includes: forming contact pads on an access surface of the multichip module to facilitate electrical testing of the module, each contact pad being electrically connected to an associated transfer wiring from a semiconductor chip in the multichip module; testing the electrical connection of each contact pad to its associated transfer wiring; and subsequent thereto, burn-in stressing and simultaneously testing at least some semiconductor chips in the multichip module by electrically connecting to the contact pads.

As still another aspect, a method for testing a multichip module having a plurality of semiconductor device chips with active circuitry is set forth. This method includes: providing a test substrate having interconnect wiring to facilitate simultaneous testing of multiple semiconductor device chips in the multichip module; temporarily electrically connecting the multichip module and the test substrate; simultaneously testing via the test substrate at least some semiconductor device chips with active circuitry within the multichip module; and electrically disconnecting the multichip module and the test substrate subsequent to the simultaneous testing of the semiconductor device chips in the module.

In a further aspect, a novel fixture is presented for burn-in stressing and testing of a multichip module having a plurality of semiconductor chips laminated together in a stack. This fixture includes a test substrate assembly and an alignment structure. The test substrate assembly has wiring preconfigured to electrically connect to a conductive pattern on an access surface of the multichip module to facilitate burn-in stressing and simultaneous testing of at least some semiconductor chips in the multichip module. The alignment structure facilitates the alignment of the conductive pattern on the access surface of the multichip module to the wiring of the test substrate assembly independent of the position of the conductive pattern on the access surface relative to an edge of the multichip module.

In another aspect, a fixture for facilitating testing of a multichip module having a plurality of semiconductor chips and a conductive pattern on an access surface is presented. The fixture includes a test interconnect substrate and a semiconductor tester device electrically connected to and mounted on the test interconnect substrate. The tester device has a conductive array which is preconfigured to electrically connect to the conductive pattern on the access surface of the multichip module. The tester device also includes active circuitry for facilitating simultaneous testing of the plurality of semiconductor chips of the multichip module when the conductive pattern on the access surface is electrically connected to the conductive array of the tester device.

To summarize, there are various aspects to the methods and apparatus of the present invention, all of which are directed to facilitating burn-in stressing and testing at the module level of a stack of laminated chips. By using removable test interconnect wiring at the module level, required input/output connections to an external test controller are significantly reduced, a key advantage since the complexity of the burn-in fixture is correspondingly reduced. Therefore, the burn-in fixture should be less expensive to build and maintain, as well as being reusable. The methods presented are applicable to extended testing as well as to burn-in stressing and testing. Further, burn-in stressing and testing can be accomplished inexpensively, without the use of an oven. Significant cost saving advantages are achieved through the less expensive fixtures and simultaneous chip testing approach presented. Finally, improved post burn-in yield of multichip modules can be attained.

BRIEF DESCRIPTION OF THE DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 2:
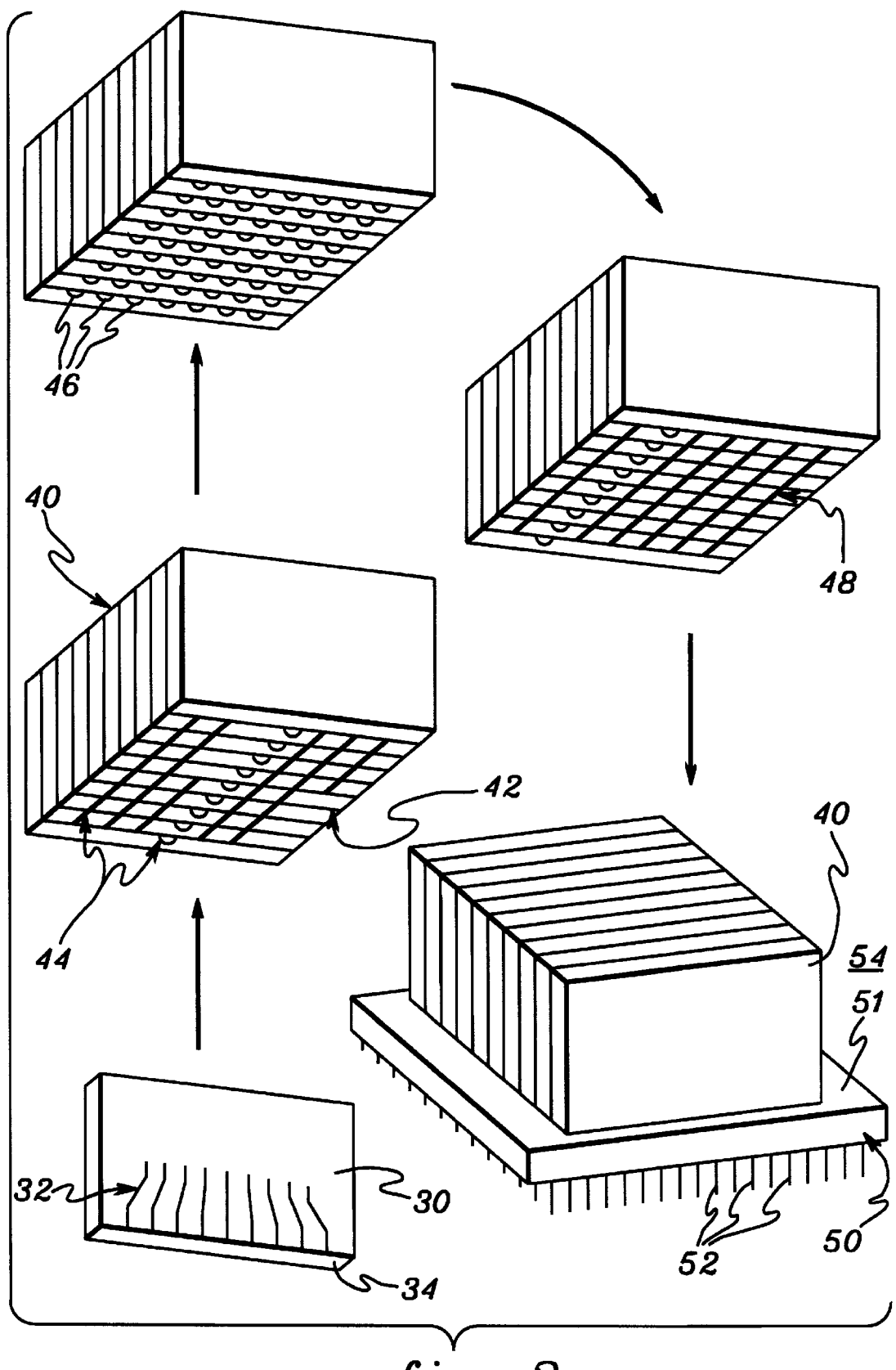
FIG. 2 is an overview of multichip module testing and application packaging in accordance with the present invention.

Described herein are various methods and apparatus for improved testing of a "multichip module" comprising a plurality of chips laminated together in a vertically-extending or horizontally-extending stack. The term "chip" is meant to be inclusive of any circuit "layer." The testing approaches presented herein ensure reliability of the multichip module and improve module yield subsequent to packaging. FIG. 2 depicts one embodiment of processing in accordance with the present invention. Each semiconductor device chip 30 has multiple transfer wirings 32 to an edge surface 34 thereof. Wireouts 32 comprise external connect lines from the individual chips 30, and include power supply connections, such as voltage and ground, and input/output connections, such as address, data and control lines.

A plurality of such chips 30 are laminated together in a vertically or horizontally extending stack to form a multichip module 40, also referred to in the art as a multichip "stack" or "cube." All the layers of the module may, but need not be, identical in function or size. For an ease of description, the terms "layer" and "chip" are used interchangeably in the specification. All of the module layers are assumed to be of identical construction in the examples that follow, facilitating an "any for any" replacement of defective chips as summarized herein. By way of example, module 40 may comprise a stack of memory chips such as dynamic random access memory chips.

An edge surface 42, referred to as an access surface, is defined by the common edge surfaces 34 of the plurality of semiconductor device chips 30 comprising module 40. This surface includes a conductive test pattern 44 in accordance with the present invention. Pattern 44, which has both bussed and individual contacts, comprises a temporary interconnect wiring which facilitates simultaneous testing of the individual chips in the multichip module. As shown, this wiring is disposed on the access surface (or surfaces) 42 of module 40. After testing, temporary interconnect wiring 44 is removed from surface 42, if desired, leaving only terminal contacts 46 on the module surface. Contacts 46 may comprise conventional solder bumps or, for example, T-connect pads electrically connected to the various transfer wirings from the individual chips in the module. Such T-connect pads are described in greater detail in commonly assigned U.S. Pat. No. 5,426,566, entitled "Multichip Integrated Circuit Packages and Systems."

Figure 1:
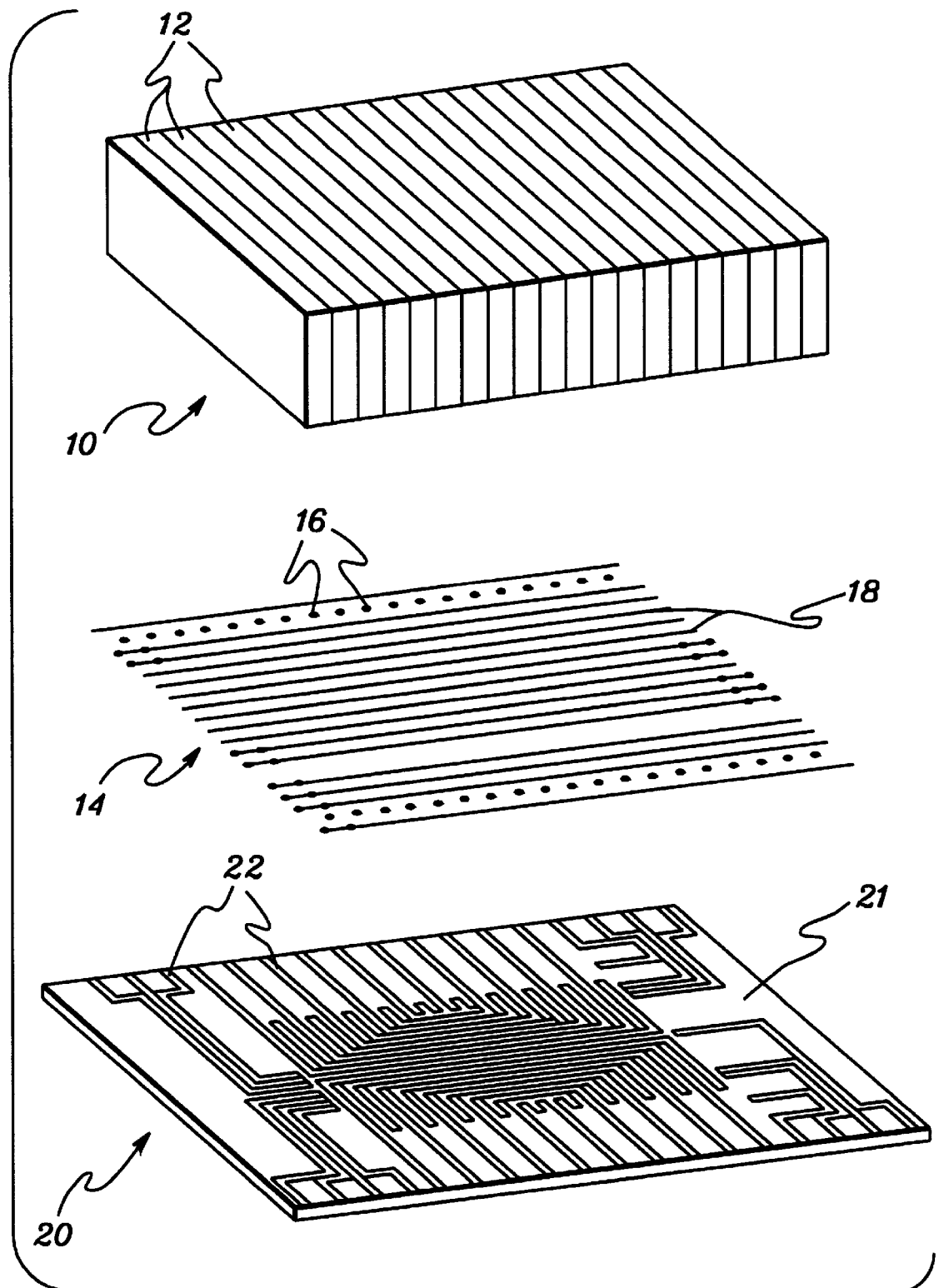
FIG. 1 is an exploded perspective view of a basic conventional multichip package.

In a next stage, an application metal 48 is disposed over the terminal contacts 46 on surface 42 of module 40. As with multichip module 10 of FIG. 1, module 40 is designed to be supported on, bonded to, and electrically connected through a carrier 50. Carrier 50 includes a predetermined metal pattern (not shown) on a module facing surface 51 which electrically couples to the application metal 48 on module surface 42. In known fashion, pins 52 (or solder bump array, etc.) of carrier 50 electrically connect the multichip package 54, comprising multichip module 40 and carrier 50, to external circuitry.

Figure 3:
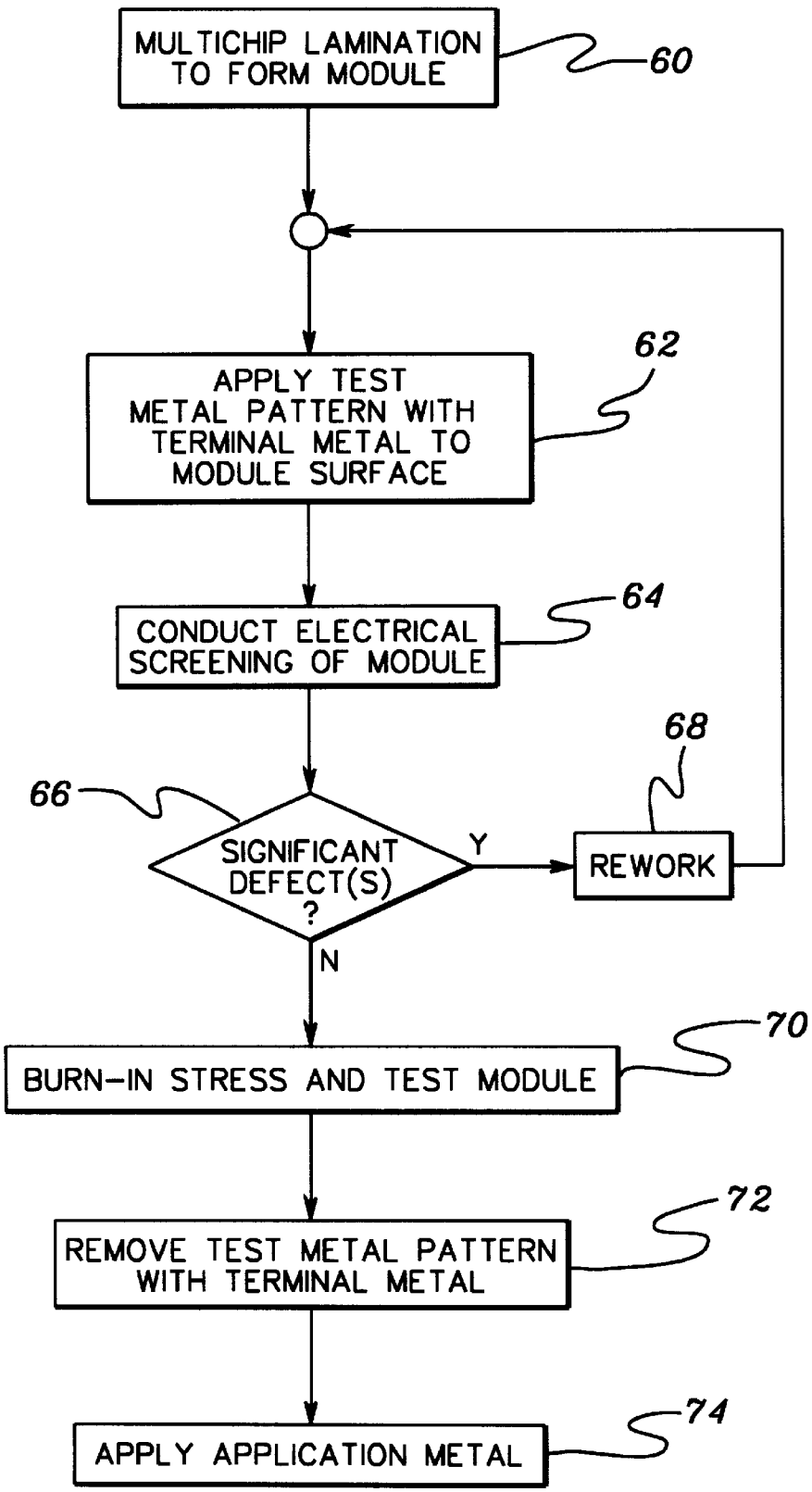
FIG. 3 is a flowchart of one embodiment of multichip module testing in accordance with the present invention.

Processing options at the various stages outlined in FIG. 2 can be better understood with reference to the detailed embodiments of the present invention presented in FIGS. 3–12. Referring first to FIG. 3, this fabrication and testing process begins with formation of a multichip module by laminating together a plurality of semiconductor device chips such that the main planar surfaces thereof are substantially parallel in a vertically-extending or horizontally-extending stack (60). Various approaches to laminating multiple individual chips together to form such a module are known in the art.

A temporary test interconnect wiring or "test metal pattern" is next applied to an access surface of the module to electrically interconnect all, or at least some, of the chips in the module (62). This temporary interconnect wiring can include bussed as well as possibly individual contacts, and may comprise a single metal level or multilevel metal on the access surface. Note, however, that the power supply terminal metals of the various integrated circuit chips in the module are preferably bussed in a limited way. To ensure that a chip cannot go into uncontrolled thermal runaway from latch up, the number of integrated circuit chips supplied by a single power line should be limited such that the total current they can draw is less than the latch up maintenance current. The connection to the power supply pads could be "fused" to this maximum limit by careful dimensioning of the power line.

Pursuant to one aspect of this invention, a two step testing process is employed. As a first test, referred to as "electrical screening" of the module, the module and temporary interconnect wiring are tested for significant or "gross" electrical defects, such as an electrical short or current draw indicative of a significant electrical wiring defect (64). Note that the multichip module is assumed to have been fabricated from individual chips which were initially one hundred (100%) percent good. The chips were laminated together and then metallized as a unit. This metallization process could have possibly introduced "gross" wiring defects, such as electrical shorts or current sinks, which would impair the operational burn-in stressing and testing of the module. If a significant defect is uncovered (66), then the multichip module undergoes partial or complete reworking (68). Reworking of the module could include mechanically grinding the access surface thereof to remove the temporary test interconnect wiring or a portion thereof, after which the wiring would be reapplied (62).

Assuming that there are no significant electrical defects or that all uncovered electrical defects are reworked, the second test, i.e., burn-in stressing and testing of the module, can occur (70). Burn-in stress and test methodologies are well known in the art. Since the integrated circuit chips within the module are normally run at a special higher voltage during burn-in stressing, the module can be allowed to self-heat to a desired temperature, with module temperature and operation being continuously monitored in part through the electrical signals provided thereto. Alternatively, a temperature control assembly could be used in association with the module as described herein below to effectuate burn-in stressing of the multichip module.

After satisfactory burn-in stressing and testing, and the mapping of any functional failures, the temporary interconnect wiring with terminal contacts is removed (72). If desired, this removal may be partial by selectively etching the temporary interconnect wiring to leave a portion thereof on the module's access surface to facilitate formation of the application metal thereon (74). For example, higher metal levels may be removed leaving only contact pads on the module's access surface.

Figure 4:
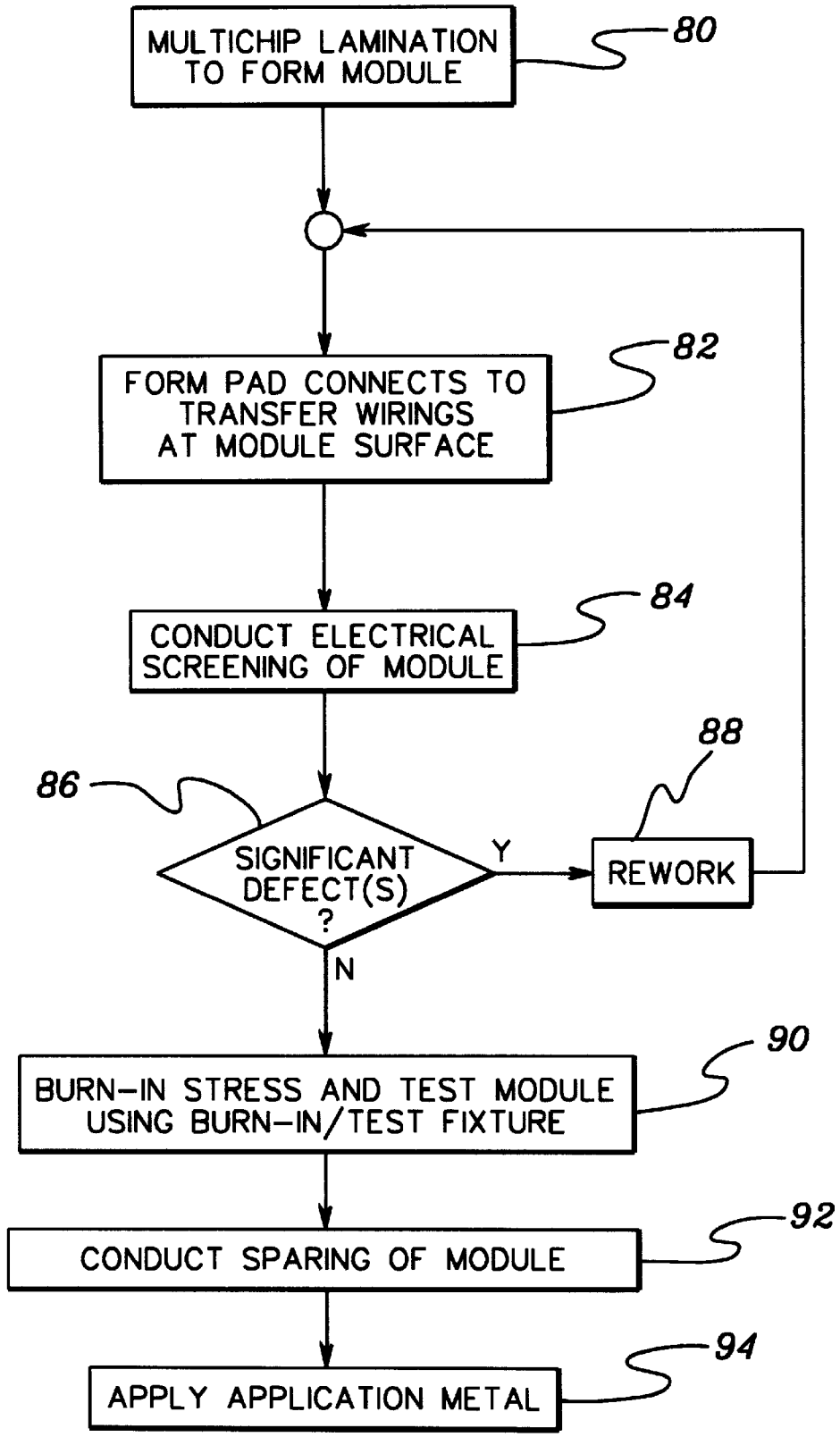
FIG. 4 is a flowchart of an alternate embodiment of multichip module testing in accordance with the present invention.

FIG. 4 depicts another embodiment of module fabrication and testing in accordance with the present invention. In this embodiment, a plurality of integrated circuit chips are again laminated in a stack to form a module (80) having at least one access surface with exposed transfer wirings from the individual chips. Pad connects are formed over the transfer wirings at the module's access surface (82) and electrical screening of the module, in accordance with the first test is conducted (84). Again, this electrical screening test seeks to identify significant electrical defects (86) which would preempt simultaneous burn-in stressing and testing of two or more chips in the multichip module. If such a wiring defect is uncovered, then the module surface can be reworked (88) to remove the pad connects, or a portion thereof which includes the electrical defect, after which the connects are reformed (82).

Figure 5:
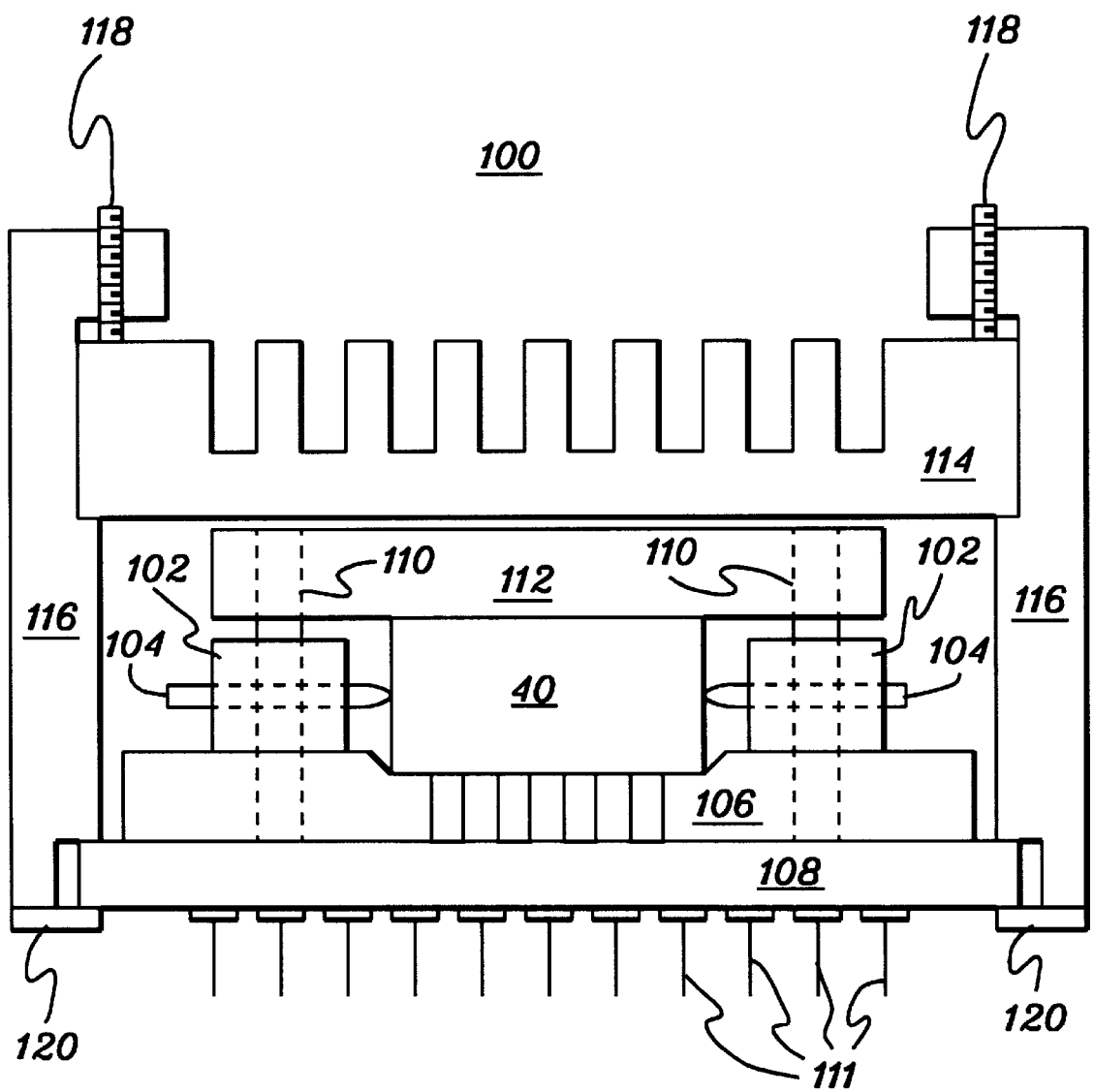
FIG. 5 is an elevational view of one embodiment of a burn-in/test fixture useful in implementing the multichip module testing embodiment of FIG. 4.

Once the module passes electrical screening, burn-in stressing and testing of the module can occur to map any functional fails, preferably using a burn-in/test fixture in accordance with the present invention (90). One embodiment of such a fixture, generally denoted 100, is depicted in FIG. 5. As shown, an alignment collar 102 having multiple alignment pins 104 retains multichip module 40 in a position such that the pad connects on the access surface thereof are aligned with the contacts of a cobra-type, 1:1 probe array 106. Array 106 electrically couples the pad connects of module 40 to a preconfigured test substrate 108 which has a substrate input/output (I/O) pin 111 distribution designed to allow fixture 100 to mount to a socket of a conventional-type test unit (not shown) controlling burn-in stressing and testing of the module. The module, probe array and test substrate are stacked such that openings therein align and the structures are held in position by dowel alignment pins 110 passing through these openings.

A heater/thermocouple assembly 112 thermally contacts at least one surface of module 40. Disposed above heater/thermocouple assembly 112 is a thermal management cap 114, which is held in position by a fixture housing 116 and set screws 118. Fixture housing 116 also includes a substrate clamp 120 which holds test substrate 108 in fixed relation relative to the other structures of the fixture.

Figure 6:
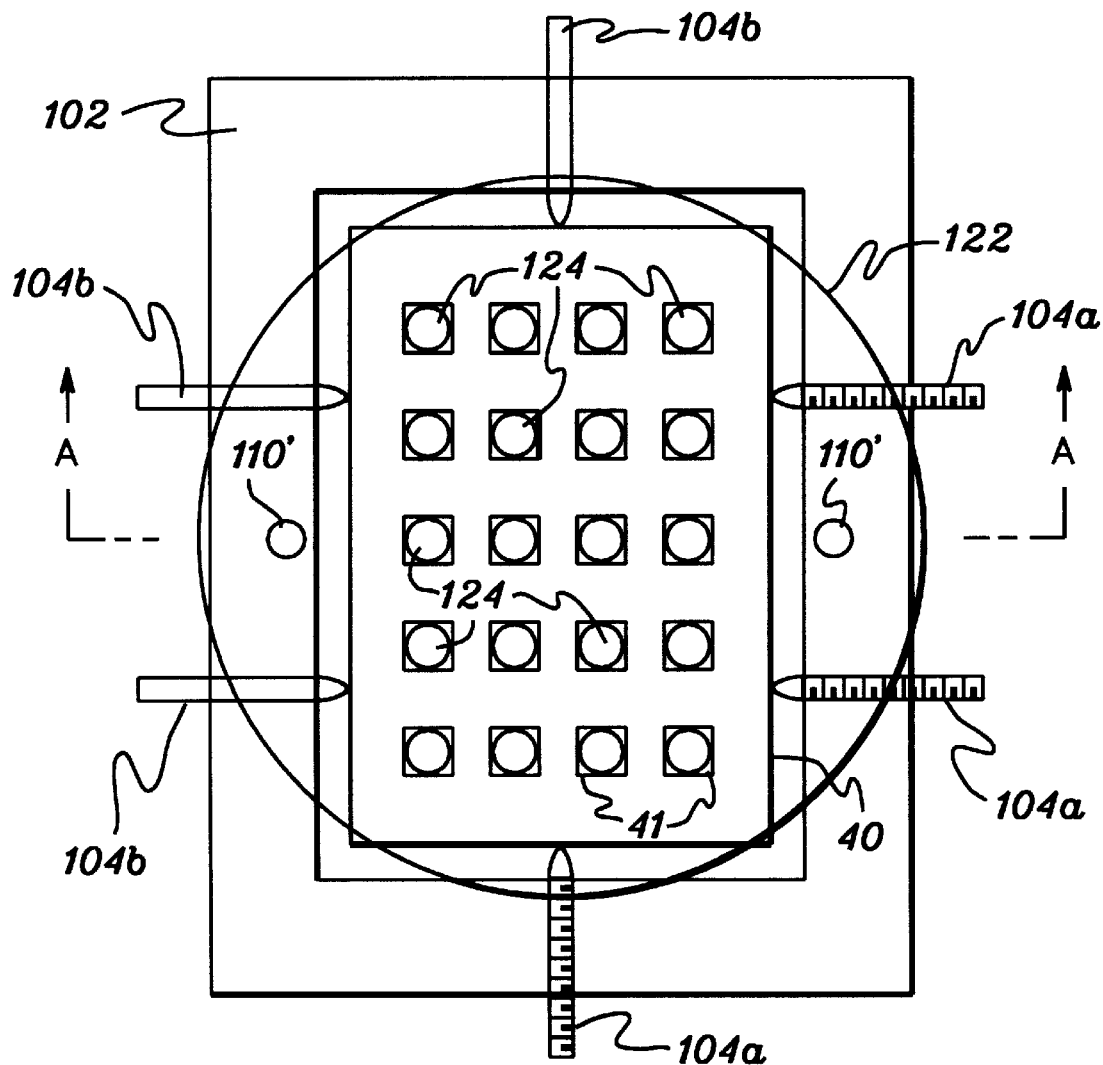
FIG. 6 is a plan view of a multichip module positioned within the alignment collar of FIG. 5 using an alignment aid in accordance with the present invention.
Figure 6A:
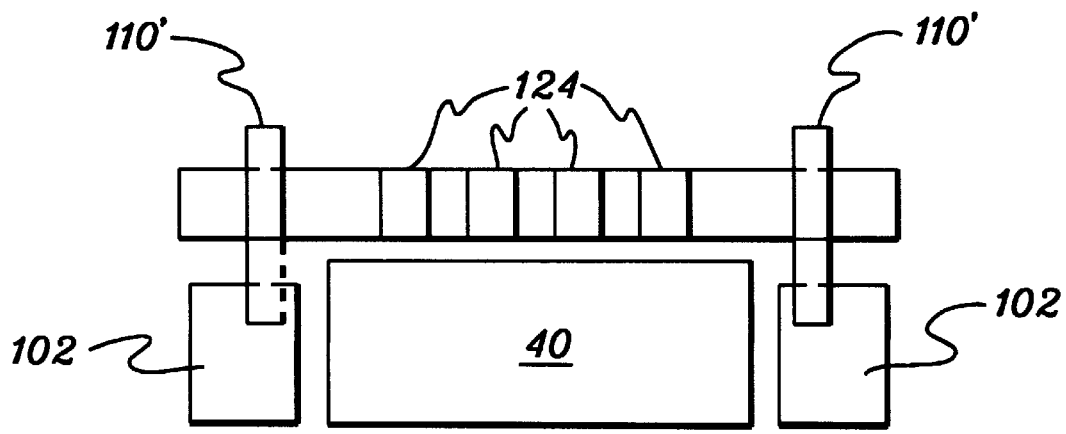
FIG. 6a is a cross-sectional view of the assembly of FIG. 6 taken along lines A—A.

A significant feature of fixture 100 is alignment of the module's terminal contacts (i.e., pad connect array or solder bump array) to corresponding contacts of the 1:1 probe array 106. Since the module's edge-to-pad connect spacing on the access surface can vary, alignment is preferably accomplished through the use of an alignment disk or aid 122 temporarily positioned over module 40 and alignment collar 102 using dowel pins 110' as shown in FIGS. 6 & 6a. Alignment disk 122 has precisely positioned holes, or marks, 124 which mirror the 1:1 probe array's pattern. In this embodiment, alignment collar 102 includes six alignment members, three of which comprise set screws 104a and the other three of which comprise spring-loaded plungers 104b. Thus, the collar can adjust and then maintain the position of module 40 relative to dowel pins 110'. Once module 40 is properly positioned relative to alignment aid 122, the module and alignment collar assembly can be placed within fixture 100 (FIG. 5) by inserting the assembly over dowel pins 110.

Returning to the process flow of FIG. 4, the results of burn-in stressing and testing, preferably using the fixture of FIGS. 5–6a, determine whether "sparing" of the module is required, and if so, a spare routing pattern to avoid the particular defects or functional fails uncovered (92). The general goal of a spare routing pattern would be to electrically isolate a defective chip in the module and to access a spare chip in the module without necessitating a change in the resultant pattern of interconnect metallization to be applied to the access surface of the module, thereby insuring that the previously fabricated supporting substrate need not be altered. The spare routing pattern can take various forms and be implemented in various ways. Such factors as the intended end use of the package, constraints in the manufacturing process, cost considerations, operational characteristics, etc., may influence the layout and implementation of the spare routing pattern.

Various examples of different spare routing patterns are presented in commonly assigned U.S. Pat. No. 5,414,637, entitled "Intra-Module Spare-Routing For High Density Electronic Packages," the entirety of which is hereby incorporated herein by reference. This incorporated Letters Patent presents physical sparing approaches to accommodating one or more identified defects. Electrical sparing is also possible. For example, reference commonly assigned U.S. patent application Ser. No. 08/220,086, entitled "Semiconductor Stack Structures and Fabrication/Sparing Methods Utilizing Programmable Spare Circuit," the entirety of which is also incorporated herein by reference.

Subsequent or simultaneous to any needed sparing of the module (92) FIG. 4), an application metallization pattern is applied to the access surface of the multichip module (94).

Figure 7:
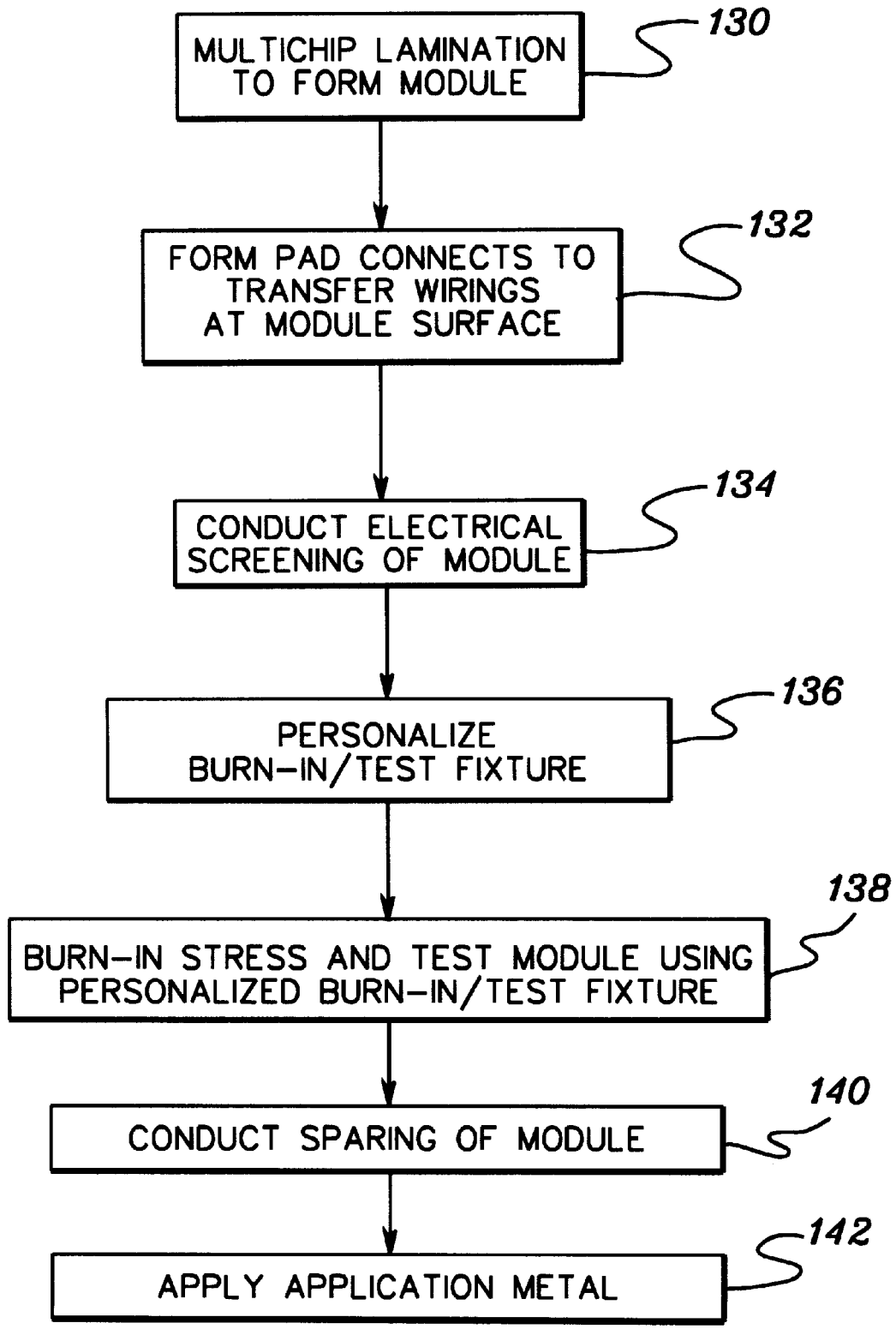
FIG. 7 is a flowchart of still another embodiment of multichip module testing in accordance with the present invention.

Another embodiment of multichip module fabrication and testing in accordance with the invention is depicted in FIG. 7. As shown, processing again begins with lamination of a plurality of semiconductor device chips into a monolithic stack to form a multichip module (130), after which pad connects are formed on the exposed transfer wirings at an access surface of the module (132). Electrical screening of the module for "gross" electrical defects is then accomplished (134), and in this embodiment, the results of the electrical screening are used to personalize a burn-in/test fixture (136). One approach for accomplishing test fixture personalization is depicted in FIG. 8.

Figure 8:
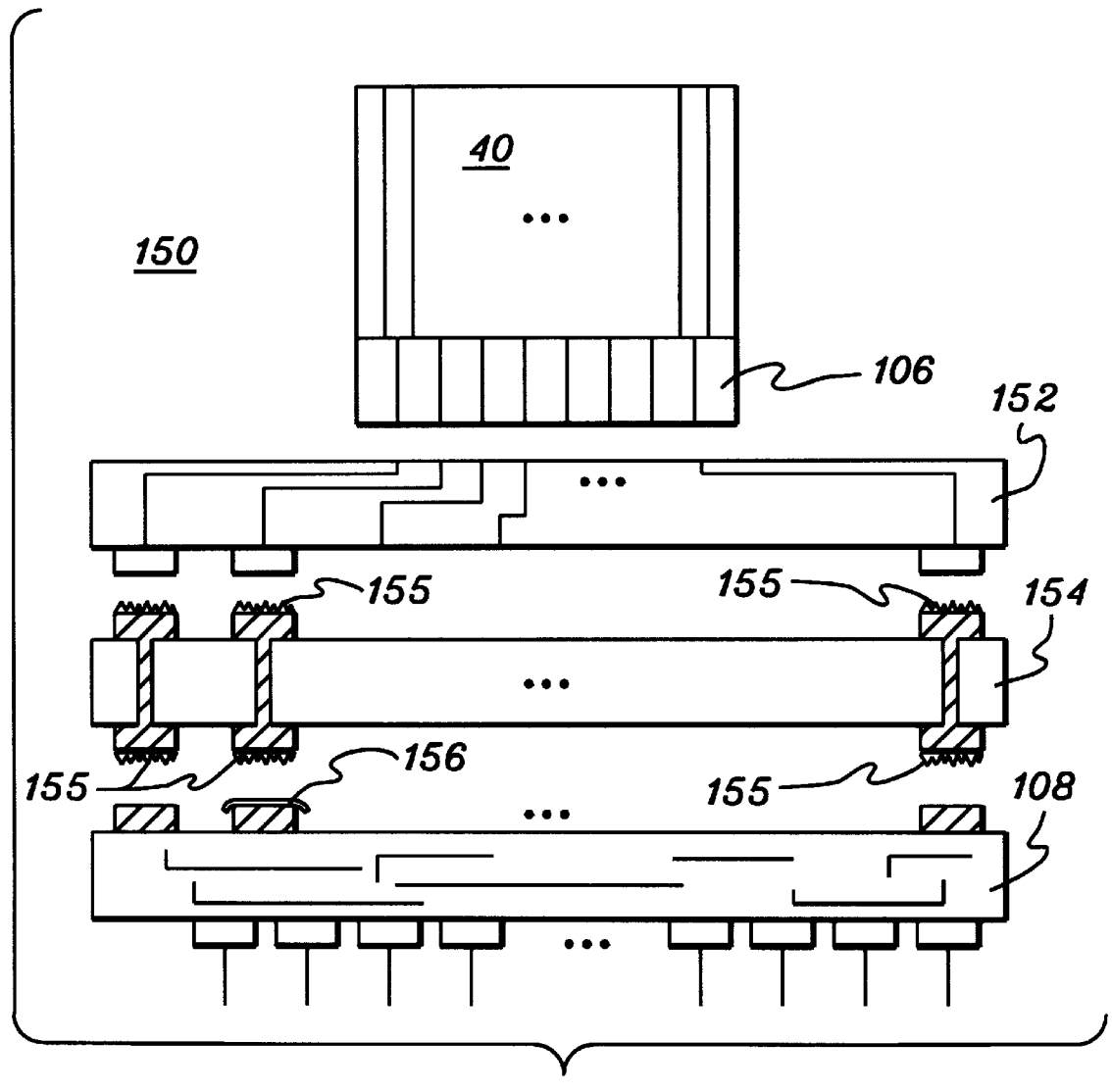
FIG. 8 is a partially exploded, elevational view of a portion of a burn-in/test fixture useful in implementing the testing process of FIG. 7.

Unless otherwise indicated, the partially shown burn-in/test fixture 150 of FIG. 8 is assumed to comprise a portion of a structure similar to that of FIGS. 5–6a. Module 40 is again electrically connected to a 1:1 probe array 106, which provides a one-to-one translation of the module's connect pads to an expander array 152, which is prewired to electrically connect a first array of pads on a first planar surface to a second, expanded array of pads on a second planar surface. Expander array 152 thus spaces the connects from module 40 and couples these expanded connects via an optional flex layer 154 to prewired test substrate 108. Those skilled in the art will note, however, that there are other ways to connect array 152 and substrate 108; for example, the dendrite connections could reside directly on expander array 152. In this embodiment, flex layer 154 includes dendrite pads 155 on both an upper and lower surface thereof having a one-to-one correspondence to the expanded pad array of expander 152 and the connection array of substrate 108. By expanding the array, insulating tape 156 can advantageously be selectively placed over one or more connections of substrate 108 to block the corresponding substrate I/O pin(s) from electrically connecting to the associated contact pads on the access surface of module 40.

Once personalized, the fixture components of FIG. 8 are assembled in a burn-in stress and test fixture such as fixture 100 (FIG. 5) for burn-in stressing and testing of the module to map any functional fails (138) (FIG. 7). Thereafter, sparing, using (for example) one or more of the above described approaches, is conducted based upon identified defects or functional fails in the module 40 (step 140—FIG. 7). Finally, the application metal is applied to the access surface of the module. If desired, the application metal can retain the contact pads already formed thereon (142).

Figure 9:
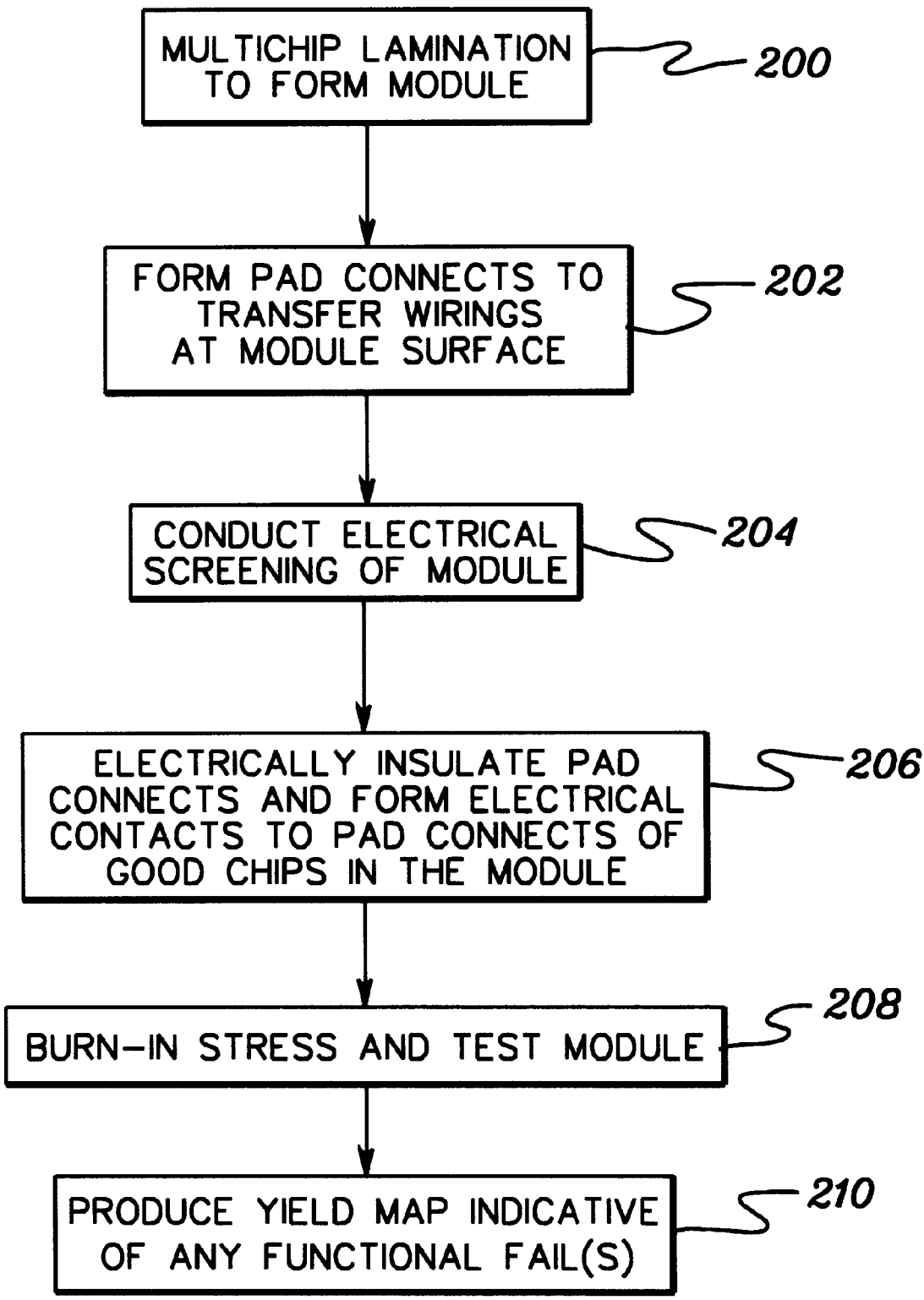
FIG. 9 is a flowchart of a further embodiment of multichip module testing in accordance with the present invention.

FIG. 9 depicts a further embodiment of a fabrication and testing approach in accordance with the present invention. After lamination of a plurality of integrated circuit chips into a module (200), pad connects are formed on an access surface of the module in electrical contact with transfer wirings thereto (202). Screening is then undertaken for significant electrical defects (204), and if present, defective pad connects are electrically insulated such that electrical contact is made only to good semiconductor device chips in the module (206). This physical sparing can comprise forming a layer of polyimide over the access surface and then selectively forming vias to the contact pads of good semiconductor device chips in the module. For a detailed explanation of various physical sparing options, reference the above-incorporated U.S. Pat. No. 5,414,637. Simultaneous burn-in stressing and testing of the module then occurs (208), preferably resulting in the production of a yield map identifying any functional fails in the module (210).

Figure 10:
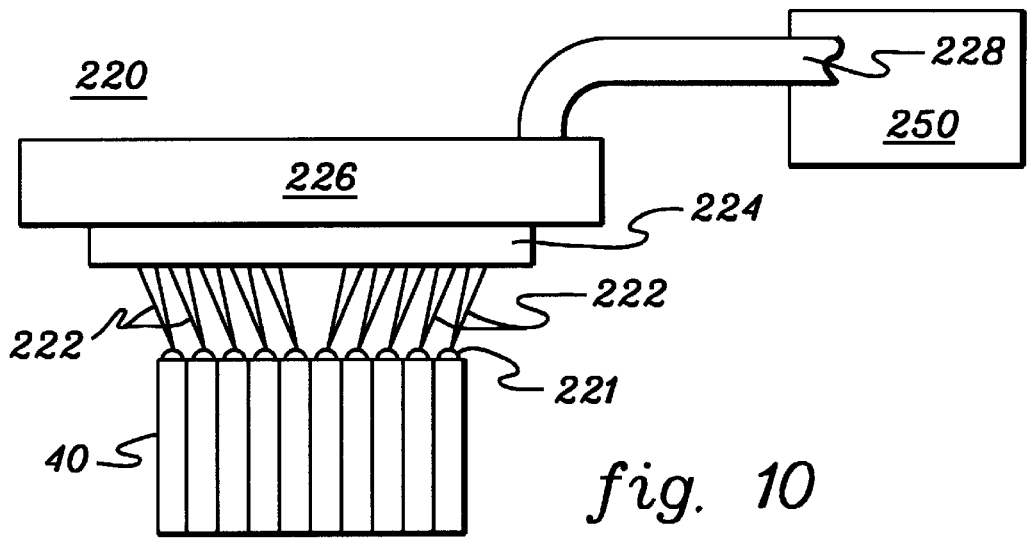
FIG. 10 is an elevational view of an alternate embodiment of a multichip module test fixture in accordance with the present invention.
Figure 11:
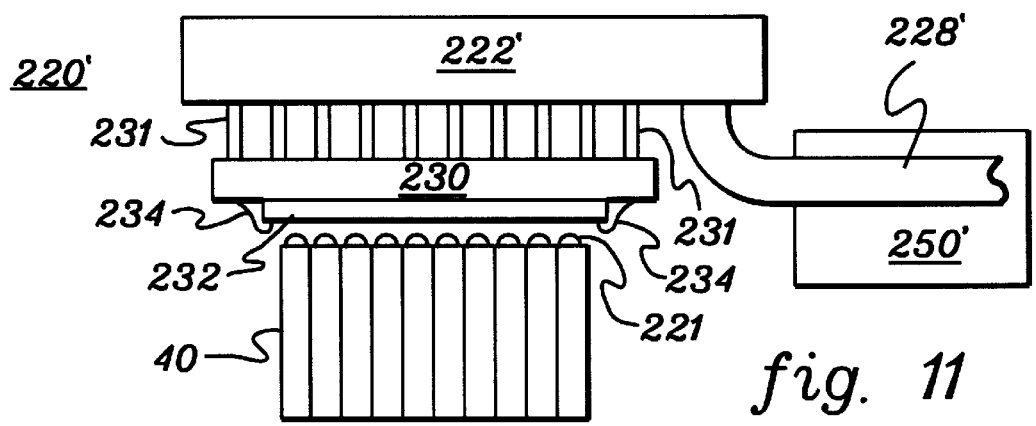
FIG. 11 is an elevational view of a modified embodiment of the multichip module test fixture of FIG. 10 employing a test chip with active circuitry.
Figure 12:
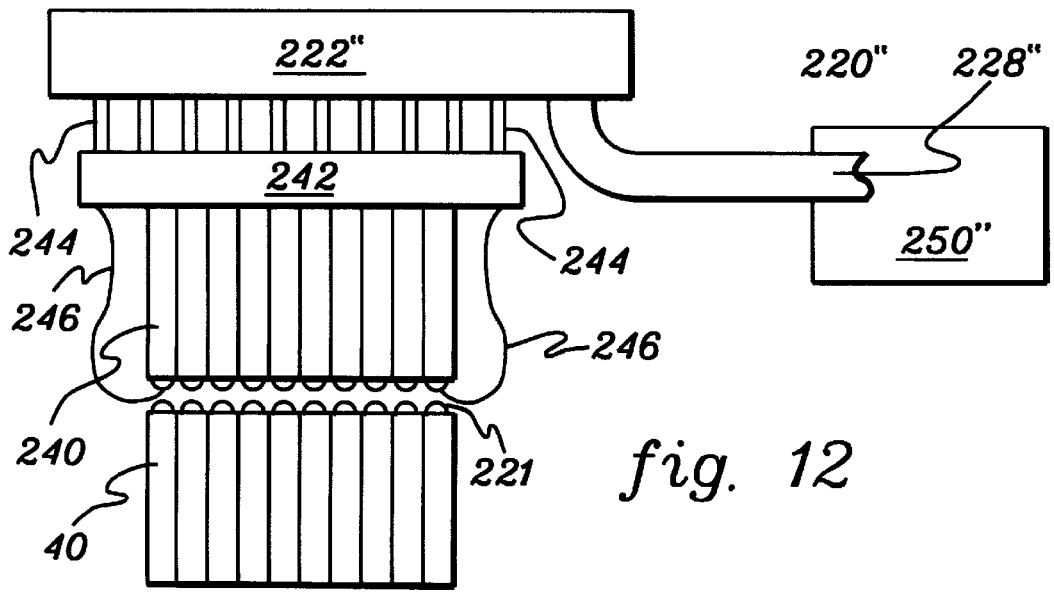
FIG. 12 is an elevational view of an alternate embodiment of the multichip module test fixture of FIG. 10 employing a test module with active circuitry to facilitate testing of the multichip module.

FIGS. 10–12 present alternative structures for accomplishing simultaneous testing of a plurality of semiconductor device chips laminated together in a stack as module 40. In FIG. 10, pad contacts 221 on an access surface of module 40 are electrically contacted by probes 222. Probes 222 couple through a probe ring 224 and a prewired substrate 226 to a multiple wire bundle 228 connected to a test unit (not shown), which generates signal levels and test patterns for application to the module. Probes 222 of test structure 220 can comprise a contactor assembly such as a "cobra probe array". This structure is described further in commonly assigned U.S. Pat. No. 4,027,935, entitled: "Contact For An Electrical Contactor Assembly."

A preferred variation on the test structure of FIG. 10 is embodied in FIG. 11 as structure 220'. Structure 220' includes a semiconductor device chip 232 which has active test circuitry therein to facilitate testing of module 40. The contact pads 221 on the access surface of module 40 are electrically connected in this embodiment directly to contact pads (not shown) of chip 232. Chip 232 is mounted on and electrically connected by wirebonds 234 to a ceramic substrate 230. This substrate 230 is in turn pin connected 231 to a larger substrate 222' with a multiplexed coax or individual wire bundle connection 228' to a relatively simple test unit (not shown). Module 40 can be connected to the test structure by reflowing solder bumps 221, and similarly removed afterwards. Other temporary means of attach, such as compressive means, are also possible.

A further alternative test structure 220" is depicted in FIG. 12. This structure 220" is substantially identical to structure 220' of FIG. 11 except that the single integrated circuit chip 232 of FIG. 11 is replaced by a module 240 comprising a plurality of integrated circuit chips. Contact pads 221 on the access surface of module 40 to be tested are electrically connected to corresponding contact pads on an exposed surface of module 240. Module 240 can be wirebond 246 connected to substrate 242 and hence to the tester unit (not shown) through pins 244, prewired substrate 222" and wire bundle 228".

Functions that the tester chip or module could include would be pattern generation, power input/output control, event logging, electrical sparing of failed dies, etc. Thus, a relatively simple test unit controller is envisioned. Additionally, the active circuitry on the tester could have the capability of multiplexing control signals for directing power levels, voltages, polarities, etc., to minimize the electrical connections to the test unit.

To summarize, those skilled in the art will note from the above discussion that various methods and apparatus have been presented herein, all of which are directed to burn-in stressing and testing at the module level of a stack of laminated chips. By using removable test interconnect wiring at the module level, required input/output connections to an external test controller are significantly reduced, a key advantage since the complexity of the burn-in fixture is correspondingly reduced. Therefore, the burn-in fixture should be less expensive to build and maintain, as well as being reusable. The methods presented are applicable to extended testing as well as to burn-in stressing and testing. Further, burn-in stressing and testing can be accomplished inexpensively, without the use of an oven. Significant cost saving advantages are achieved through the less expensive fixtures and simultaneous chip testing approach presented. Finally, improved post burn-in yield of multichip modules can be attained.

While the invention has been described in detail herein in accordance with certain preferred embodiments thereof, many modifications and changes therein may be effected by those skilled in the art. For example, those skilled in the art should recognize that the novel tester embodiments presented herein could be readily employed in testing a single integrated circuit chip, rather than a multichip module as described. Accordingly, it is intended by the appended claims to cover all such modifications and changes as fall within the true spirit and scope of the invention.

We claim:

1. A fixture for burn-in stressing and testing of a multichip module having a plurality of integrated circuit chips, said fixture comprising:

a test substrate assembly having wiring preconfigured to electrically connect to a conductive pattern on an access surface of said multichip module to facilitate burn-in stressing and simultaneous testing of at least some integrated circuit chips in the multichip module, said conductive pattern including multiple contact pads and said wiring being preconfigured to electrically connect to at least some contact pads of said multiple contact pads, wherein said plurality of integrated circuit chips comprise a plurality of bare integrated circuit chips stacked together to form said multichip module; and an alignment structure for aligning said at least some contact pads of the conductive pattern on the access surface of the multichip module to said wiring of the test substrate assembly, wherein said alignment structure includes a plurality of adjustable module engaging members, said adjustable module engaging members being adapted to contact at least one edge of the multichip module for transverse positioning of the multichip module relative to the wiring of the test substrate assembly to facilitate alignment of said at least some contact pads of the conductive pattern on the access surface of the multichip module to said wiring of the test substrate assembly.

2. The fixture of claim 1, wherein said test substrate assembly comprises a 1:1 probe array and a test interconnect substrate, said alignment structure aligning said at least some contact pads of the conductive pattern on the access surface of the multichip module to said 1:1 probe array and said 1:1 probe array to said test interconnect substrate, said test interconnect substrate including wiring for interconnecting the at least some integrated circuit chips of the multichip module to facilitate burn-in stressing and simultaneous testing of the at least some integrated circuit chips of the multichip module.

3. The fixture of claim 2, wherein said alignment structure comprises an alignment collar having said plurality of adjustable module engaging members for positioning said conductive pattern on the access surface of said multichip module relative to said 1:1 probe array.

4. The fixture of claim 3, further comprising a temperature control assembly for burn-in stressing of said multichip module, said temperature control assembly being in thermal contact with said multichip module when said alignment structure aligns the conductive pattern on the access surface of the multichip module to the test substrate assembly.

5. The fixture of claim 4, wherein said alignment collar, 1:1 probe array, test interconnect substrate and temperature control assembly each include openings disposed so as to be aligned when said alignment collar with said multichip module positioned therein, 1:1 probe array, test interconnect substrate and temperature control assembly are stacked together in predefined relation, and wherein said fixture further comprises alignment dowels sized to pass through said openings and hold said test alignment collar, 1:1 probe array, test interconnect substrate, and temperature control assembly in fixed alignment when stacked together in said predefined relation.

6. The fixture of claim 3, further in combination with an alignment aid for positioning said multichip module within said alignment collar using said plurality of adjustable module engaging members such that when said alignment collar with said multichip module positioned therein is disposed within said fixture, said conductive pattern on said access surface of said multichip module aligns with said 1:1 probe array.

7. A method for burn-in stressing and testing a multichip module using the fixture of claim 1, said method comprising:

(a) aligning said multichip module within said fixture such that at least some contact pads of a conductive pattern on an access surface of the multichip module are electrically coupled to said wiring of the test substrate assembly, wherein said aligning is accomplished using said plurality of adjustable module engaging members to transversely adjust positioning of said multichip module within said fixture relative to the wiring of the test substrate assembly; and (b) burn-in stressing and simultaneously testing at least some integrated circuit chips of the multichip module by providing electrical signals to the multichip module through the test substrate assembly.

\* \* \* \* \*